(12) United States Patent
Rooney et al.

(10) Patent No.: US 11,200,105 B2
(45) Date of Patent: Dec. 14, 2021

(54) NORMALIZATION OF DETECTING AND REPORTING FAILURES FOR A MEMORY DEVICE

(71) Applicant: Micron Technology, Inc., Boise, ID (US)

(72) Inventors: Randall J. Rooney, Boise, ID (US); Gregg D. Wolff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 122 days.

(21) Appl. No.: 16/237,163

(22) Filed: Dec. 31, 2018

(65) Prior Publication Data

US 2020/0210267 A1 Jul. 2, 2020

(51) Int. Cl.
*G06F 11/07* (2006.01)
*G11C 29/44* (2006.01)
*G11C 29/52* (2006.01)
*G06F 11/30* (2006.01)
*G06F 11/00* (2006.01)

(52) U.S. Cl.
CPC ........ *G06F 11/0766* (2013.01); *G06F 11/008* (2013.01); *G06F 11/3037* (2013.01); *G06F 11/3072* (2013.01); *G11C 29/44* (2013.01); *G11C 29/52* (2013.01); *G06F 2201/81* (2013.01); *G06F 2201/88* (2013.01)

(58) Field of Classification Search
CPC .. G06F 11/30; G06F 11/3003; G06F 11/3037; G06F 2201/88; G06F 2201/81; G06F 2201/885
See application file for complete search history.

(56) References Cited

U.S. PATENT DOCUMENTS

| | | | | |
|---|---|---|---|---|
| 6,480,982 B1 * | 11/2002 | Chan | ...................... | G06F 11/106 714/764 |
| 9,299,457 B2 * | 3/2016 | Chun | ................... | G06F 11/1076 |
| 9,710,317 B2 * | 7/2017 | Gupta | .................... | G06F 3/0653 |
| 9,711,240 B2 * | 7/2017 | Kuribara | ................ | G11C 16/26 |
| 9,747,148 B2 * | 8/2017 | Healy | .................... | G06F 3/0653 |
| 2015/0363261 A1 * | 12/2015 | Warnes | ................. | G06F 11/106 714/721 |
| 2017/0269979 A1 * | 9/2017 | Gollub | ................. | G06F 11/0727 |
| 2020/0192795 A1 * | 6/2020 | Cai | ..................... | G06F 12/0292 |

* cited by examiner

*Primary Examiner* — Amine Riad
(74) *Attorney, Agent, or Firm* — Perkins Coie LLP

(57) ABSTRACT

Methods, systems, and apparatuses related to detecting and reporting failures for a memory device are described. When a count of bit-flip errors is above a fail threshold, a memory device can report a failure. Failure reports can indicate a rate at which the memory device is accumulating errors. An offset fail threshold may be applied instead of a default fail threshold, such as a standardized or specified threshold. The offset fail threshold can be a summation of the default fail threshold and an offset determined from an initial error count determined before the memory device has accumulated errors from use.

20 Claims, 6 Drawing Sheets

NORMALIZATION OF DETECTING AND REPORTING FAILURES FOR A MEMORY DEVICE

TECHNICAL FIELD

The present disclosure generally relates to memory devices, and more specifically, relates to detecting and reporting failures in memory devices based on customized thresholds.

BACKGROUND

Memory devices are widely used to store information related to various electronic devices such as computers, wireless communication devices, cameras, digital displays, and the like. Memory devices may be volatile or non-volatile and can be of various types, such as magnetic hard disks, random access memory (RAM), read only memory (ROM), dynamic RAM (DRAM), synchronous dynamic RAM (SDRAM), and others. Information is stored in various types of RAM by charging a memory cell to have different states. Improving RAM memory devices, generally, can include increasing memory cell density, increasing read/write speeds or otherwise reducing operational latency, reducing processing overhead, increasing reliability, increasing data retention, reducing power consumption, or reducing manufacturing costs, among other metrics.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
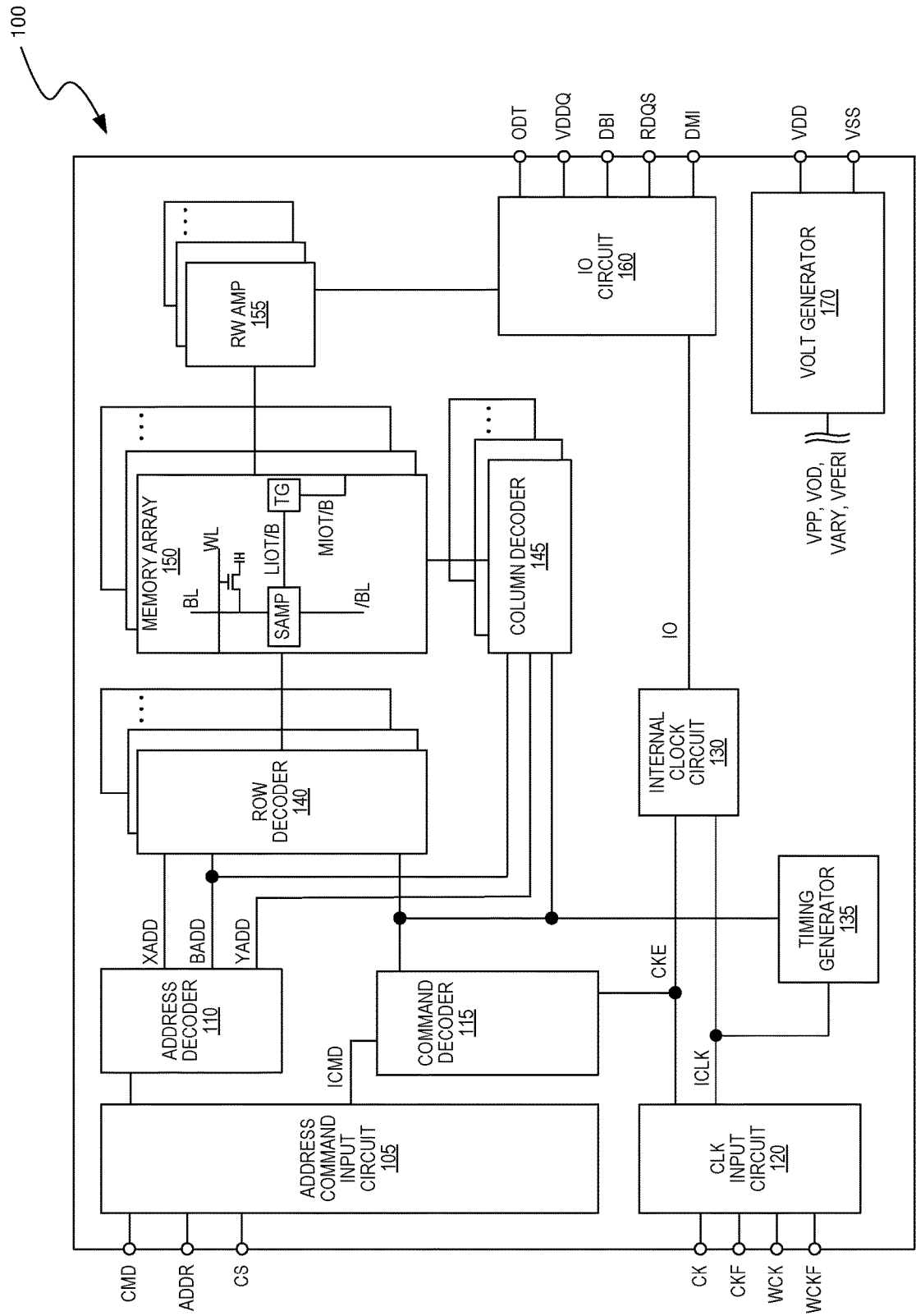
FIG. 1 illustrates a simplified block diagram schematically illustrating a memory device, in accordance with an embodiment of the present technology.

Some semiconductor memory devices, such as DRAM, perform error check and scrub ("ECS") procedures, which include various error checking and correction operations. For example, embodiments of DRAM use error correction codes (ECC) to correct single bit-flip errors. An ECS procedure can record a number of errors (e.g. flipped bits) identified during the ECS procedure. When the recorded number of errors is above a fail threshold, the ECS procedure can report a failure condition for the memory device.

In some cases, one or more reported failures can be used to determine, e.g., a durability measure for the memory device (e.g. how quickly it is wearing out), a level of use of the memory device, expected remaining memory device life, etc. For example, where a fail threshold is set at 64 errors, an ECS procedure may record 67 errors at a time 187. Because 67 is above the fail threshold of 64 errors, the memory device reports a failure. This failure report can help determine a rate at which the memory device is accumulating errors, e.g. the memory device accumulated 67 bit-flip errors in 187 time units. However, in this example the 64-error fail threshold was simply a default value, e.g. set by a manufacturer of the memory device. In a memory device, some errors can be caused by manufacturing defects, while others can be caused by wear on the memory device as a result of usage patterns. The errors caused by manufacturing defects generally offer no diagnostic clues as to the durability of a memory device, as these errors generally do not accumulate or worsen over time. Accordingly, the use of a fail threshold number of errors that does not take into account the particular baseline number of errors experienced by a memory device from causes other than use will provide less useful diagnostic information, and may erroneously indicate an end-of-life status of the memory device due to a high number of static, non-worsening errors caused by, e.g., defects caused during manufacturing.

Aspects of the present disclosure address the above and other deficiencies by generating an offset fail threshold. The offset fail threshold can be a summation of a default threshold and an offset determined from an error count from an initial ECS procedure. Additional details on generating an offset fail threshold are provided below in relation to FIG. 3. The generated offset fail threshold can then be used to trigger failure reporting procedures that account for a baseline amount of errors. When the memory device performs an ECS procedure, it can obtain a count of total errors discovered. When this error count is at least as large as the offset fail threshold, failure reporting procedures can be initiated. Additional details on identifying when to trigger failure reporting procedures are provided below in relation to FIG. 2. In some implementations, the failure reporting procedures can include simply reporting a failure. In other implementations, the failure reporting procedures only report a failure the first time the error count is within each of a set of error count ranges. Additional details on failure reporting procedures that use a set of error count ranges are provided below in relation to FIG. 4.

While existing memory devices report failures, they do not account for a baseline amount of errors. As a result, these existing memory devices can report failures early, which can reduce the effective life of a memory device as the memory devices can be determined to be wearing out faster than they actually are. In addition, these existing memory devices can suffer from excessive failure reporting procedures, creating unneeded overhead and wasting processing resources. However, by generating and using an offset fail threshold that accounts for the baseline amount of memory device errors, as described herein, failure reports are more useful, more accurate, and are less often triggered unnecessarily.

FIG. 1 is a block diagram schematically illustrating a memory device 100 in accordance with an embodiment of the present technology. The memory device 100 may include an array of memory cells, such as memory array 150. The memory array 150 may include a plurality of banks, and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least one respective main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, a mode register. The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

Processes 200, 300, and 400, described below, provide failure reporting in memory devices based on customized thresholds. Processes 200, 300, and 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In various implementations, one or more of processes 200, 300, or 400 can be performed by a specifically designated circuit, e.g. an error check and scrub (ECS) circuitry 560 on a DRAM die, or can be performed by other firmware or software, e.g. through instructions executed by a host controller either on the memory device or external to the memory device, such as a CPU.

Although processes 200, 300, and 400 are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Figure 2:
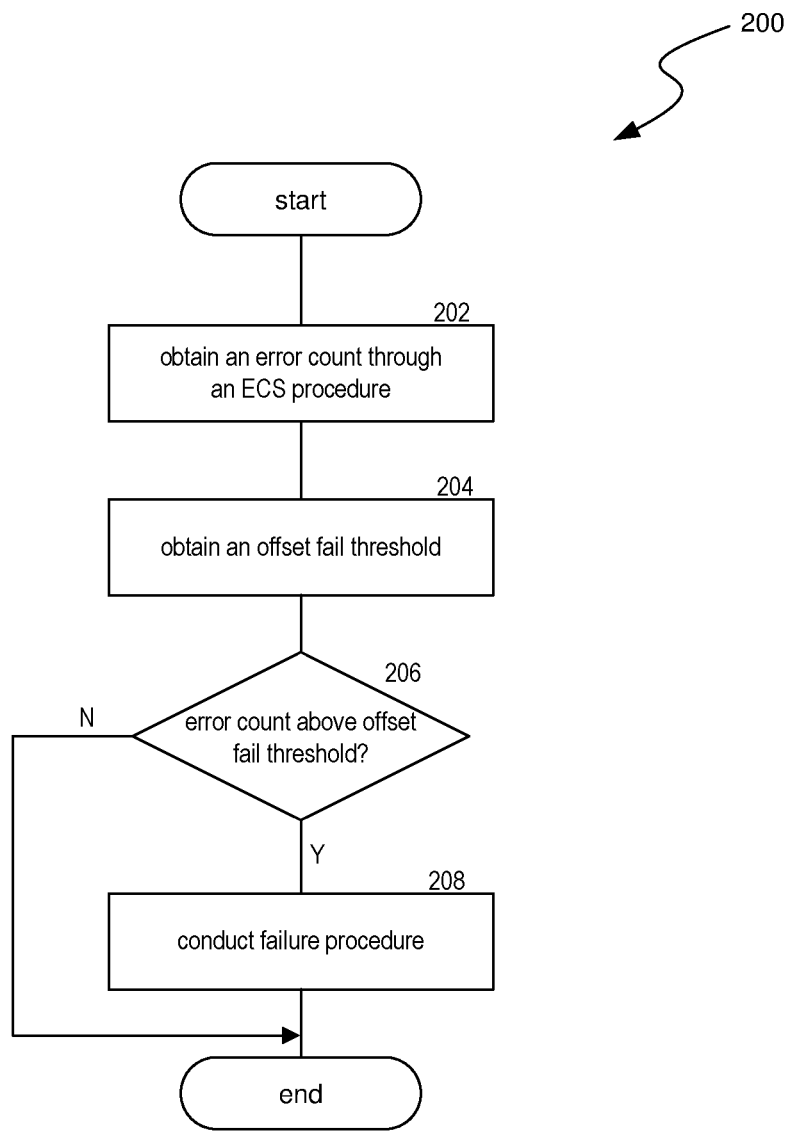
FIG. 2 is a flow diagram of using a fail threshold that is based on an offset to trigger a failure procedure, in accordance with some embodiments of the present disclosure.

FIG. 2 is a flow diagram of an example process 200 for using a fail threshold that incorporates an offset to trigger a failure procedure, in accordance with some embodiments of the present disclosure. In some implementations, process 200 can be performed by logic integrated into a memory device, e.g. DRAM memory device 100. In some implementations, process 200 can be performed by a processor or other controller for a memory device. In some implementations, process 200 can be implemented following an error check and scrub (ECS) procedure.

At block 202, process 200 can obtain an error count through an ECS procedure. An ECS procedure can perform various error checks and/or correction procedures, e.g. by applying error correction codes (ECC). For example, ECC codes can include block codes such as repetition, parity, hamming, or cyclic. Using a block code, a block of data bits is encoded to include a set of corresponding parity bits. The parity bits can be used to detect one or more single bit errors caused by bit-flips in the block of data bits. The number of detectable bit-flips depends on the ratio of the number of parity bits to the number of original data bits per block. Some memory devices are configured to detect up to one or two bit-flips per block. In some implementations, other ECC procedures can be used, such as triple modular redundancy. ECS procedures can read part or all of a memory array, detect errors, and attempt to correct detected errors. The ECS procedure can produce a count of detected (and possibly corrected) errors, e.g. a count of identified bit-flips. In some implementations, this count can be expressed as a rate, e.g. errors per gigabit.

At block 204, process 200 can obtain an offset fail threshold. An offset fail threshold can be a threshold number of errors that occur during an ECS procedure before a failure is reported. As discussed in more detail below in relation to FIG. 3, an offset fail threshold can be computed by adding an initial count of errors that occur during an initial ECS procedure to a default fail threshold. In some implementations, an initial ECS procedure can be the first ECS procedure following a memory device reset or power-on (e.g., boot or initialization) event. A default fail threshold can be a fail threshold set in a specification for a memory device, such as by the device manufacturer or vendor. In some cases, the offset fail threshold can be computed in each instance of process 200 by obtaining the initial error count offset and adding it to the default fail threshold. In other implementations, the offset fail threshold can be determined once (e.g. during process 300), stored, and later retrieved at block 204.

At block 206, process 200 can compare the error count from block 202 with the offset fail threshold from block 204. If the comparison indicates the total count of errors is greater than (or greater than or equal to) the offset fail threshold, process 200 can continue to block 208. Otherwise, process 200 can end.

At block 208, process 200 can conduct failure procedures. In some implementations, failure procedures can be reporting a failure. In other implementations, the failure procedures use a set of fail report error ranges, such that a failure report is only generated once per fail report error range for a memory device. More specifically, the system tracks which fail report error range the last failure report corresponded to or the number of errors that occurred which caused the last failure report. A new fail report is only generated if the error count from block 202 corresponds to an fail report error range above the fail report error range for the last failure report. Additional details on using fail report error ranges to control sending failure reports are provided below in relation to FIG. 4.

Figure 3:
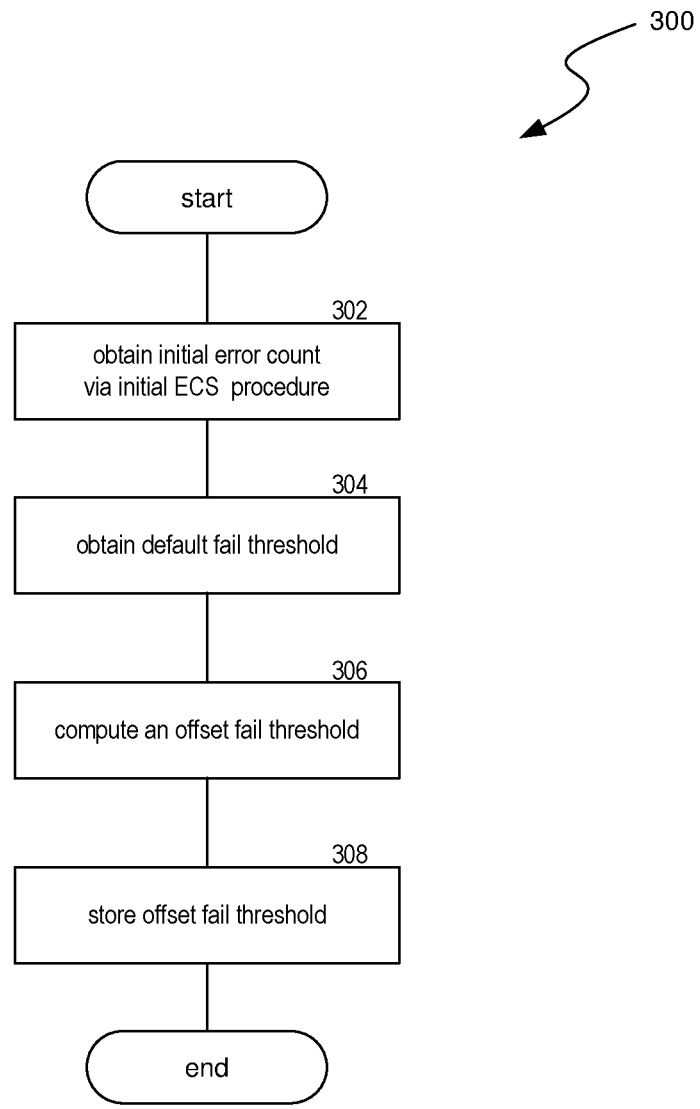
FIG. 3 is a flow diagram of generating a fail threshold that is based on an offset, in accordance with some embodiments of the present disclosure.

FIG. 3 is a flow diagram of an example process 300 for generating a fail threshold that is based on an offset, in accordance with some embodiments of the present disclosure. In some implementations, process 300 can be performed by logic integrated into a memory device, e.g. DRAM memory device 100. In some implementations, process 300 can be performed by a processor or other controller for a memory device. In some implementations, process 300 can be performed in response to a memory device initialization, such as when it is powered-on or reset.

At block 302, process 300 can obtain an initial error count via an initial error check and scrub (ECS) procedure. As discussed above, an ECS procedure can use various error correction codes (ECCs) to identify and, in some cases correct, errors that can occur in a memory array. The ECS procedure can keep a count for identified errors, such as a total count or a rate at which the errors occurred (e.g. errors per gigabit). The memory device can be configured to not trigger error reporting procedures in response to the initial ECS procedure, no matter how many errors are identified. The error count identified at block 302 can be considered a baseline number of errors that are not due to use of the memory device but may be attributable to other factors such as imperfections in components of the memory device.

At block 304, process 300 can obtain a default fail threshold. The default fail threshold can be set in a specification for the memory device such as in an ECS specification. In various implementations, the default fail threshold can be programmed in memory allocated on the memory device, such as in a mode register or other persistent memory, e.g., by a user, a device manufacturer, or a distributer. When the memory device is initialized, the default fail threshold can be read from the allocated memory location. In some implementations, the default fail threshold can be increased by an increase amount programmed in a second memory location (e.g., in another mode register). For example, a device manufacturer can set an initial default fail threshold in a first mode register and a user can increase the default fail threshold by setting an increase amount in a second mode register.

At block 306, process 300 can compute an offset fail threshold. The offset fail threshold can be a summation of the initial error count determined at block 302 and the default fail threshold obtained at block 304. In some implementations, offset fail thresholds can be set to a value from a specified series of intervals (e.g. defined by increments of five, ten, or any power of two). In these cases, the offset fail threshold can be set to the closest or next highest interval as compared to the summation of the initial error count and the default fail threshold. For example, where the intervals are powers of two (i.e. 2, 4, 8, 16, 32, 64, etc.), and where the summation of the initial error count and the default fail threshold is 37, 64—the next highest power of two—can be selected as the offset fail threshold.

At block 308, process 300 can store the offset fail threshold, e.g. in a mode register. In various implementations, the offset fail threshold can be stored separately from the default fail threshold or can replace the default fail threshold. In some implementations, instead of computing the offset fail threshold and storing it as part of process 300, only the offset from block 302 can be stored, and the offset fail threshold can be computed, as in block 306, each time it is needed.

Figure 4:
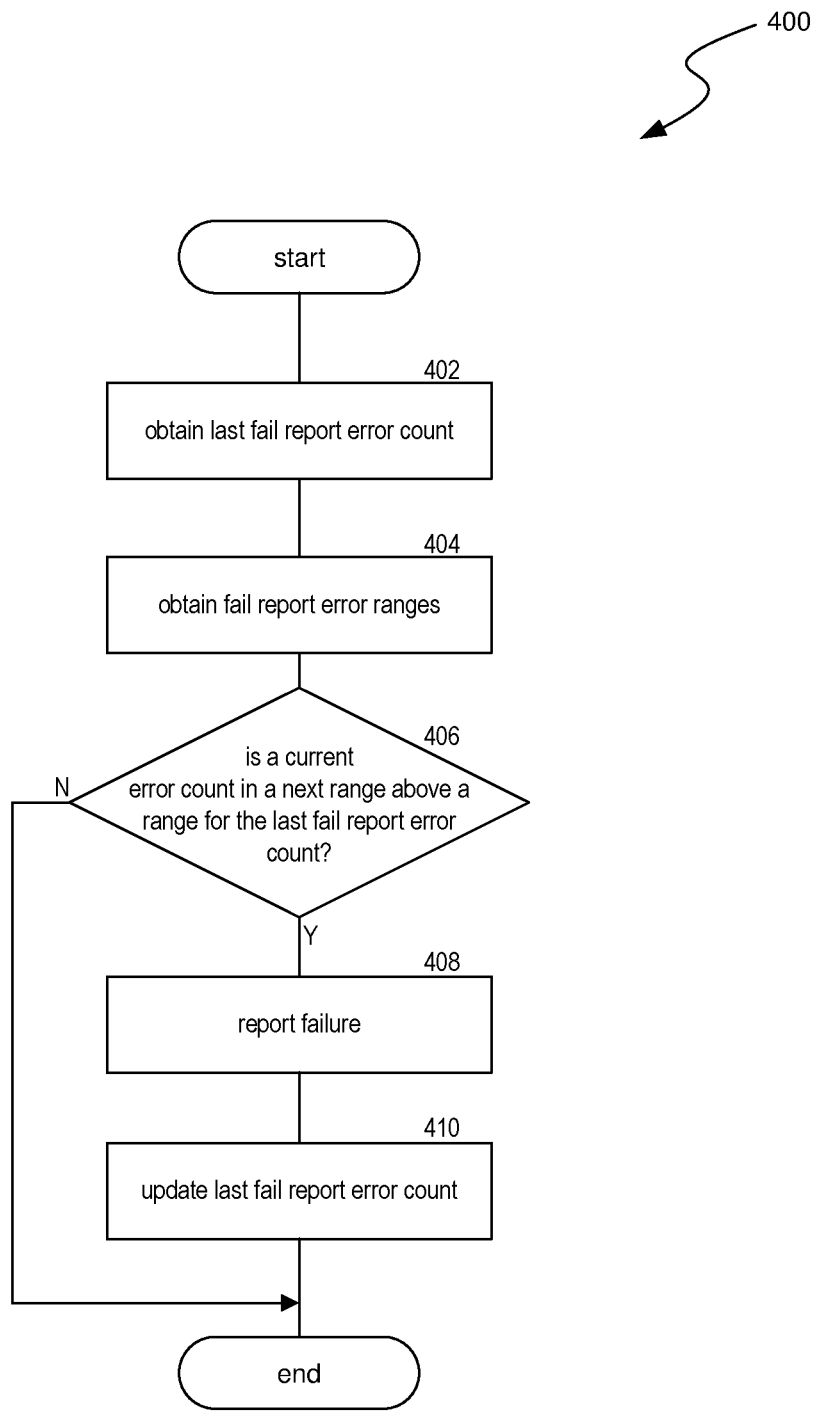
FIG. 4 is a flow diagram of a failure procedure that incorporates fail report error ranges, in accordance with some embodiments of the present disclosure.

FIG. 4 is a flow diagram of an example process 400 for a failure procedure that incorporates fail report error ranges, in accordance with some embodiments of the present disclosure. In some implementations, process 400 can be performed by logic integrated into a memory device, e.g. DRAM memory device 100. In some implementations, process 400 can be performed by a processor or other controller for a memory device.

At block 402, process 400 can obtain a value indicative of an error range for a previously reported failure. In various implementations, this value can be an error count for the last failure report or an indication of which range a last error report corresponded to. The value obtained at block 402 can be a value stored at block 410 in a previous execution of process 400. If no previous error has been reported, process 400 can use a zero-errors or a range-zero default value.

At block 404, process 400 can obtain failure report error ranges. Failure report error ranges can be set intervals (e.g. every 64 errors) or can be increasing amounts (e.g. power of two increments). The failure report error ranges can be ranges in addition to an offset fail threshold (e.g. computed at block 306). For example, an offset fail threshold can be set at 57 bit-flip errors and failure report error ranges can be set at powers of two, starting at 64 errors. Thus, in this example, the first four failure report error ranges would be 121-184, 185-312, 313-568, and 569-1080 (i.e. the range delineators are: 57+64, 57+128, 57+256, 57+512, and 57+1024).

At block 406, process 400 can use the failure report error ranges from block 404 to determine whether a current error count is in a range above the range corresponding to the error count for the last failure report from block 402. If not, process 400 can end. If so, process 400 can continue to block 408. At block 408, process 400 can report a failure. At block 410, process 400 can update the value for the last error report, e.g. by storing the error count for the last failure report or by storing the range corresponding to the reported error.

Figure 5:
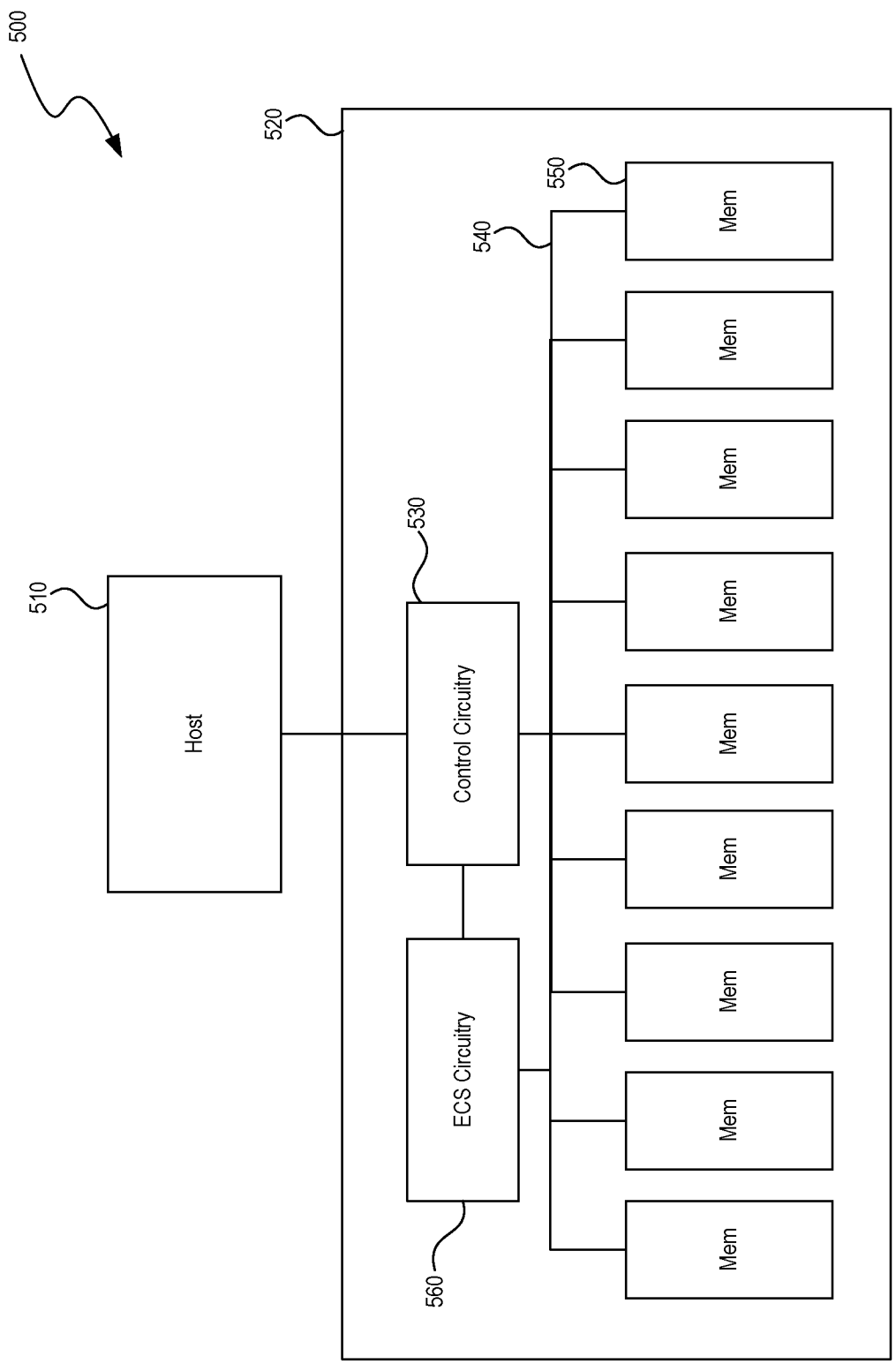
FIG. 5 is a simplified block diagram of an example memory system, in accordance with some embodiments of the present disclosure.

FIG. 5 is a simplified block diagram 500 schematically illustrating a memory system, e.g. including memory device 100, in accordance with an embodiment of the present technology. Memory system 500 includes a host device 510 operably coupled to a memory module 520 (e.g., a dual in-line memory module (DIMM)). Memory module 520 can include a control circuitry 530 operably connected by a bus 540 to a plurality of memory devices 550. Control circuitry 530 can perform functions such as buffering, redriving, etc. In some implementations, memory system 500 can have a ECS circuitry 560 designated to perform ECS procedures and/or failure reporting for memory array 150. In addition or alternatively, ECS procedures and/or failure reporting can be performed by other firmware or software, e.g. through instructions executed by a controller either on the memory device or external to the memory device, such as a CPU. In accordance with one aspect of the present disclosure, when the memory device 550 is initialized or powered on, it can perform initial ECS procedures to determine a baseline error count which will be added to a default fail threshold to determine an offset fail threshold. In subsequent ECS procedures, when the resulting error count is above the offset fail threshold, the memory device can conduct failure procedures, such as reporting a failure or reporting for a failure range if it is the first time the error count is in the failure range.

Figure 6:
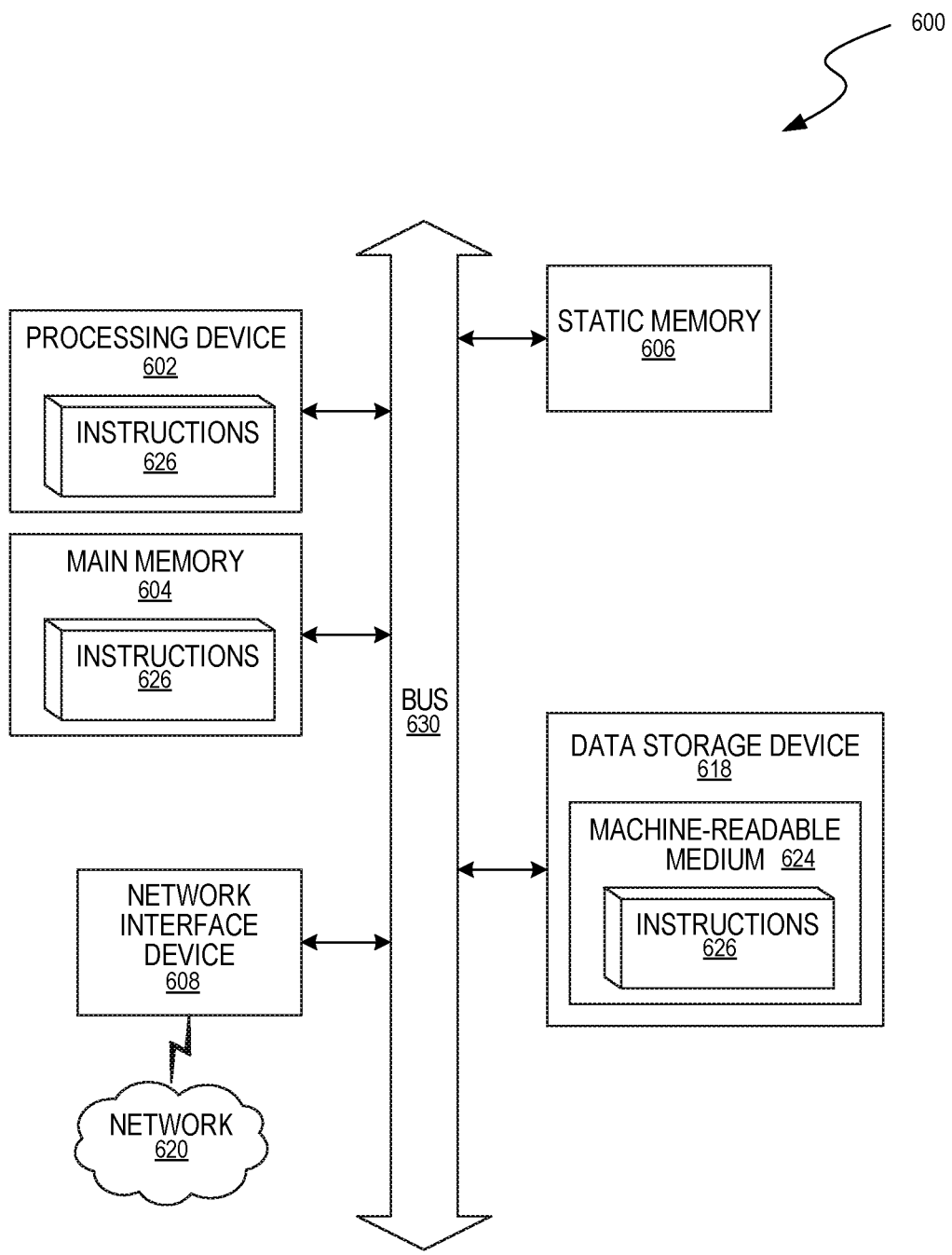
FIG. 6 is a simplified block diagram of an example computer system, in accordance with some embodiments of the present disclosure.

FIG. 6 illustrates an example machine of a computer system 600 within which a set of instructions, for causing the machine to perform any one or more of the methodologies discussed herein, can be executed. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media.

While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

Those skilled in the art will appreciate that the components and blocks illustrated in FIGS. 1-6 described above, may be altered in a variety of ways. For example, the order of the logic may be rearranged, substeps may be performed in parallel, illustrated logic may be omitted, other logic may be included, etc. In some implementations, one or more of the components described above can execute one or more of the processes described below.

Reference in this specification to "implementations" (e.g. "some implementations," "various implementations," "one implementation," "an implementation," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Being above a threshold can mean that the item under comparison is greater than or equal to the threshold or is strictly greater than the threshold. Being below a threshold can mean that the item under comparison is less than or equal to the threshold or is strictly less than the threshold. Relative terms, such as high or unimportant, when not otherwise defined, can be understood as assigning a value and determining how that value compares to an established threshold. For example, the phrase "selecting a fast connection" can be understood to mean selecting a connection that has a value assigned corresponding to its connection speed that is above a threshold.

As used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

Any patents, patent applications, and other references noted above are incorporated herein by reference. Aspects can be modified, if necessary, to employ the systems, functions, and concepts of the various references described above to provide yet further implementations. If statements or subject matter in a document incorporated by reference conflicts with statements or subject matter of this application, then this application shall control.

What is claimed is:

1. A memory device comprising:
a memory array;
first circuitry configured to check for errors in at least a part of the memory array and determine a count of errors found; and
second circuitry configured to:
determine an offset fail threshold based on a default fail threshold and an initial count of errors found by the first circuitry;
compare a subsequent count of errors found by the first circuitry with the offset fail threshold; and
cause a failure procedure to be conducted when the comparison indicates the subsequent count of errors found by the first circuitry is greater than the offset fail threshold.

2. The memory device of claim 1, configured to:
identify a previous error range for a previously reported failure; and
report a failure in response to determining that the subsequent count of errors is within a next error range that is greater than the previous error range.

3. The memory device of claim 2, wherein a difference between a lower bound for the next error range and an upper bound for the next error range is based on the offset fail threshold.

4. The memory device of claim 1, configured to transmit signaling indicative of a failure.

5. The memory device of claim 1, configured to determine the offset fail threshold by adding the default fail threshold to the initial count of errors and adjusting the result of the adding to be a next highest value in a specified series of intervals.

6. The memory device of claim 1, wherein the memory device is a DRAM device.

7. A method comprising:
determining an initial error count, for a memory device, via an error checking procedure;
identifying a default fail threshold;
computing an offset fail threshold based on a summation of the initial error count and the default fail threshold;
comparing the offset fail threshold with a further error count that is from another implementation of the error checking procedure; and
initiating a failure procedure when the further error count is greater than the offset fail threshold.

8. The method of claim 7 further comprising:
identifying an error range, from two or more non-overlapping fail report error ranges, for a first reported failure; and
reporting a second failure in response to determining that the further error count is within an error range, of the two or more fail report error ranges, that is greater than the error range for the first reported failure.

9. The method of claim 8,
wherein each of the two or more fail report error ranges corresponds to a delineation of a low count of errors and a high count of errors; and
wherein a difference between the low count of errors and the high count of errors for each of the two or more fail report error ranges is a multiple of the offset fail threshold.

10. The method of claim 8,
wherein each of the two or more fail report error ranges corresponds to a delineation of a low count of errors and a high count of errors; and
wherein a difference between the low count of errors and the high count of errors, for each of the two or more fail report error ranges, is the same.

11. The method of claim 8,
wherein each of the two or more fail report error ranges corresponds to a delineation of a low count of errors and a high count of errors; and wherein the difference between the low count of errors and the high count of errors, for all but a first of the two or more fail report error ranges, is a power of two greater than the previous range of the two or more fail report error ranges.

12. The method of claim 7, further comprising:
reporting a failure for the memory device based at least in part on identifying a quantity of failures that meets or exceeds the computed offset threshold.

13. The method of claim 7,
wherein the memory device is a DRAM device; and
wherein the error checking procedure that generated the initial error count is in response to a power-on or a reset of the DRAM device.

14. The method of claim 7, wherein the memory device is configured to not produce a failure report in response to the initial error count.

15. The method of claim 7, wherein computing the offset fail threshold comprises adjusting the summation to be a next value, in a specified series of intervals, that is greater than the summation result.

16. A method comprising:
determining an offset fail threshold based on a default fail threshold and an initial count of errors for a memory device;
performing an error check in at least a part of a memory array of the memory device to determine a count of errors;
comparing the count of errors with the offset fail threshold; and
initiating a failure procedure at the memory device in response to the comparison indicating that the count of errors is greater than the offset fail threshold.

17. The method of claim 16, further comprising:
identifying a first error range for a first failure; and
reporting a second failure in response to determining that the count of errors is within a second error range with a lower bound that is greater than an upper bound for the first error range.

18. The method of claim 17, wherein a difference between the lower bound for the second error range and an upper bound for the second error range is based on the offset fail threshold.

19. The method of claim 16, further comprising:
transmitting signaling that indicates an expected end-of-life for the memory device after initiating the failure procedure at the memory device.

20. The method of claim 16, further comprising:
computing a summation of the default fail threshold and the initial count of errors; and
selecting, as the offset fail threshold, a value from a specified series of intervals that is a value in the series greater than the result of the summation.

* * * * *